(12) United States Patent
Ho et al.

(10) Patent No.: US 6,281,719 B1
(45) Date of Patent: Aug. 28, 2001

(54) OUTPUT PAD PRECHARGE CIRCUIT FOR SEMICONDUCTOR DEVICES

(75) Inventors: Tien-Shin Ho, Hsin-Tien; Chun-Hsiung Hung, Hsinchu; Kuen-Long Chang, Taipei; I-Long Lee, Hsinchu, all of (TW); Ray Lin Wan, Fremont, CA (US)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/431,346

(22) Filed: Oct. 29, 1999

(51) Int. Cl.[7] ............................. H03B 1/00; H03K 3/00
(52) U.S. Cl. ............................... 327/108; 365/203
(58) Field of Search .................. 327/108, 112, 327/376, 377; 326/58, 83–87; 365/203, 204

(56) References Cited

U.S. PATENT DOCUMENTS

| 4,988,888 | 1/1991 | Hirose et al. | 307/443 |
| 5,058,066 | 10/1991 | Yu | 365/189.05 |
| 5,151,621 | 9/1992 | Goto | 307/475 |
| 5,204,838 | 4/1993 | Son et al. | 365/203 |
| 5,377,149 | 12/1994 | Gaultier | 365/203 |
| 6,038,186 | * 3/2000 | Tanizaki | 365/222 |
| 6,130,843 | * 10/2000 | Lee | 365/189.05 |
| 6,185,141 | * 2/2001 | Hosbita et al. | 365/203 |

* cited by examiner

*Primary Examiner*—My-Trang Nuton
(74) *Attorney, Agent, or Firm*—Mark A. Haynes; Haynes & Beffel LLP

(57) ABSTRACT

An output driver for an integrated circuit performs a precharge function before internal data is available, minimizing the access time for such data. Also, the pull up and pull down circuitry used in the precharge function is separate from the output driver, and independent of the level of the data signal to be driven. A sense circuit senses an initial state of the output pad, before the output signal is supplied to the output pad, which indicates whether a voltage level on the output pad is above a threshold or below the threshold. A precharge circuit includes a pull up circuit and a pull down circuit. The pull up circuit is responsive to the initial state indicating that the voltage level on the output is below the threshold, and the pull down circuit is responsive to the initial state indicating that the voltage level on the output is above the threshold. A detector is coupled to the output, and produces a control signal indicating when output is near the threshold. Logic is responsive to the control signal from the detector to turn off the precharge circuit when the threshold is reached.

19 Claims, 5 Drawing Sheets

OUTPUT PAD PRECHARGE CIRCUIT FOR SEMICONDUCTOR DEVICES

BACKGROUND OF THE INVENTION

1. Field of the Invention

The present invention relates to integrated circuit devices, particularly integrated circuit memory devices, having output terminals, and to circuitry for precharging the output terminals to reduce the time needed to drive output signals on such output terminals.

2. Description of Related Art

Integrated circuits have output terminals, typically referred to as output pads, on which signals are driven for access by external circuitry. The output pads typically have significant capacitance. For this reason output driver circuitry is included that uses large transistors to drive the output pads, or that consumes a significant amount of time in driving in the output pads to the desired signal level. As integrated circuits become more complex, and operate at higher speeds, the area and speed trade-off involved in the output drivers becomes more critical.

For integrated circuit memory devices, the read access time is becoming a critical parameter. The read access time is measured from the beginning of a read cycle until the time that data is available on the output pads for use by the external circuitry.

The access time can be considered to have two components. The first component consists of the amount of time between the time a read signal is received by the device, and the time internal data is available to the output driver. The second component consists of the amount time that takes the output driver to change the level of the output pad to a level acceptable for use by external circuits. The first component is largely controlled by the architecture of the memory device. The second component involves the performance of the output driver, and the charge on the pad when the output driver is enabled. Thus, if the output voltage is to be driven to a high level, and the pad is charged near ground at the beginning of the cycle, then the time required to reach a suitable voltage level is longer. Likewise, if the output voltage is to be driven to a low level, and the pad is charged near a high level at the beginning of the cycle, then the time required is longer.

It is desirable to ensure that the output pad is precharged to a level near the middle of the voltage range. In this way, the output driver has a shorter distance to move the voltage on the pad in the worst-case, and can accomplish its task in a shorter, more predictable time interval. In this application, unless apparent from the context, the word "precharge" is intended to the both charging up from a low voltage to a higher voltage, and charging down from a high voltage to a lower voltage. In this way, we avoid repeatedly using such phrases as "precharge and/or predischarge."

Background concerning technology that has been developed to address the problem of output driver precharge can be found in U.S. Pat. No. 5,151,621 entitled HIGH-SPEED OUTPUT BUFFER UNIT THAT PRELIMINARILY SETS THE OUTPUT VOLTAGE LEVEL; U.S. Pat. No. 5,058,066 entitled OUTPUT BUFFER PRECHARGE CIRCUIT FOR DRAM; U.S. Pat. No. 4,988,888 entitled CMOS OUTPUT CIRCUIT WITH INTERMEDIATE POTENTIAL SETTING MEANS; U.S. Pat. No. 5,204,838 entitled HIGH SPEED READOUT CIRCUIT; U.S. Pat. No. 5,377,149 entitled OUTPUT PRECHARGE CIRCUIT FOR MEMORY.

Taking the '621 patent for example, the precharge circuitry suffers the disadvantage that it relies on the same driver for precharging as used for driving the actual data. This has the disadvantage that as speeds increase, undesirable noise can be injected into the read path. The '621 patent inserts transmission gates between the internal circuitry and output buffer to prevent this problem with noise. However, the transmission gates consume significant area in the output driver, offsetting some of the benefits of the precharge circuitry. The '621 patent also suffers the disadvantage that it relies on sensing the previous output data value, and storing such value in a latch (e.g. $31d$). It is possible that the voltage on the output terminal could drift between the read cycles, causing the precharge circuit to be initialized incorrectly.

Accordingly, it is desirable to provide a more efficient pull up and pull down circuit for use in precharging output terminals of integrated circuits, which operates quickly and with predictable timing consumes less standby current, and uses minimum space on integrated circuit.

SUMMARY OF THE INVENTION

The present invention provides an output driver for an integrated circuit which performs a precharge function before internal data is available, minimizing the access time for such data. Also, the pull up and pull down circuitry used in the precharge function is separate from the output driver, and independent of the level of the data signal to be driven. Furthermore, the invention provides a low-power and compact designed not taught in the prior art.

The invention can be characterized as a driver for an output of integrated circuit. It includes a driver to supply an output signal to the output. A sense circuit senses an initial state of the output pad, before the output signal is supplied to the output pad, which indicates whether a voltage level on the output pad is above a threshold or below the threshold. A precharge circuit is coupled the output, and responsive to the sense circuit, to drive the output to near the threshold in response to the initial state and before the output signal is supplied the output.

In various embodiments, the precharge circuit includes a pull up circuit and a down circuit. The pull up circuit is responsive to the initial state indicating that the voltage level on the output is below the threshold, and the pull down circuit is responsive to the initial state indicating that the voltage level on the output is above the threshold. A detector is coupled to the output, and produces a control signal indicating when output is near the threshold. Logic is responsive to the control signal from the detector to turn off the precharge circuit.

The circuit further includes logic that produces a control signal in response to a data output event, such as a read cycle on an integrated circuit memory. The control signal indicates the beginning of the data output event, before data is available from internal circuits responding to the event. The sense circuit is responsive to the control signal indicating the beginning of the event to store the initial state. The logic further produces a second control signal which is used to start and stop the precharge interval. At the beginning of the assertion of the second control signal, the precharge circuit is enabled, and responsive to the stored initial state to turn on either the pull up or the pull down circuit. When the level on the output is near the threshold, the detector turns off the precharge circuit. At the end of the assertion of the second control signal, the precharge circuit is disabled, and the output driver is enabled to supply the output signal to the output.

In one embodiment, the sense circuit comprises a latch that is responsive to a first control signal indicating the beginning of the data output event to store a value indicating the initial state of the output pad. Also, the detector comprises a gate, such as a NOR gate, that is only enabled during assertion of the second control signal.

According to another aspect of the invention, an integrated circuit memory device is provided including a memory array, read circuitry, and an output driver. The sense circuit and precharge circuit described above are included on the integrated circuit memory device to provide for high-speed reading of data.

Accordingly, the present invention provides precharge circuit which operates by detecting an initial value of the output pad at the beginning of the data output event, and pulling up or pulling down the voltage on the output pad, in response to the initial value during a timed precharge interval, prior to the enabling of the output driver for the data output event. The invention provides a precharge circuit having predictable timing, supporting high-speed operation, and using minimal area on the device.

Other aspects and advantages of the present invention can be seen on review of the figures, the detailed description, and the claims which follow.

DETAILED DESCRIPTION

Figure 1:
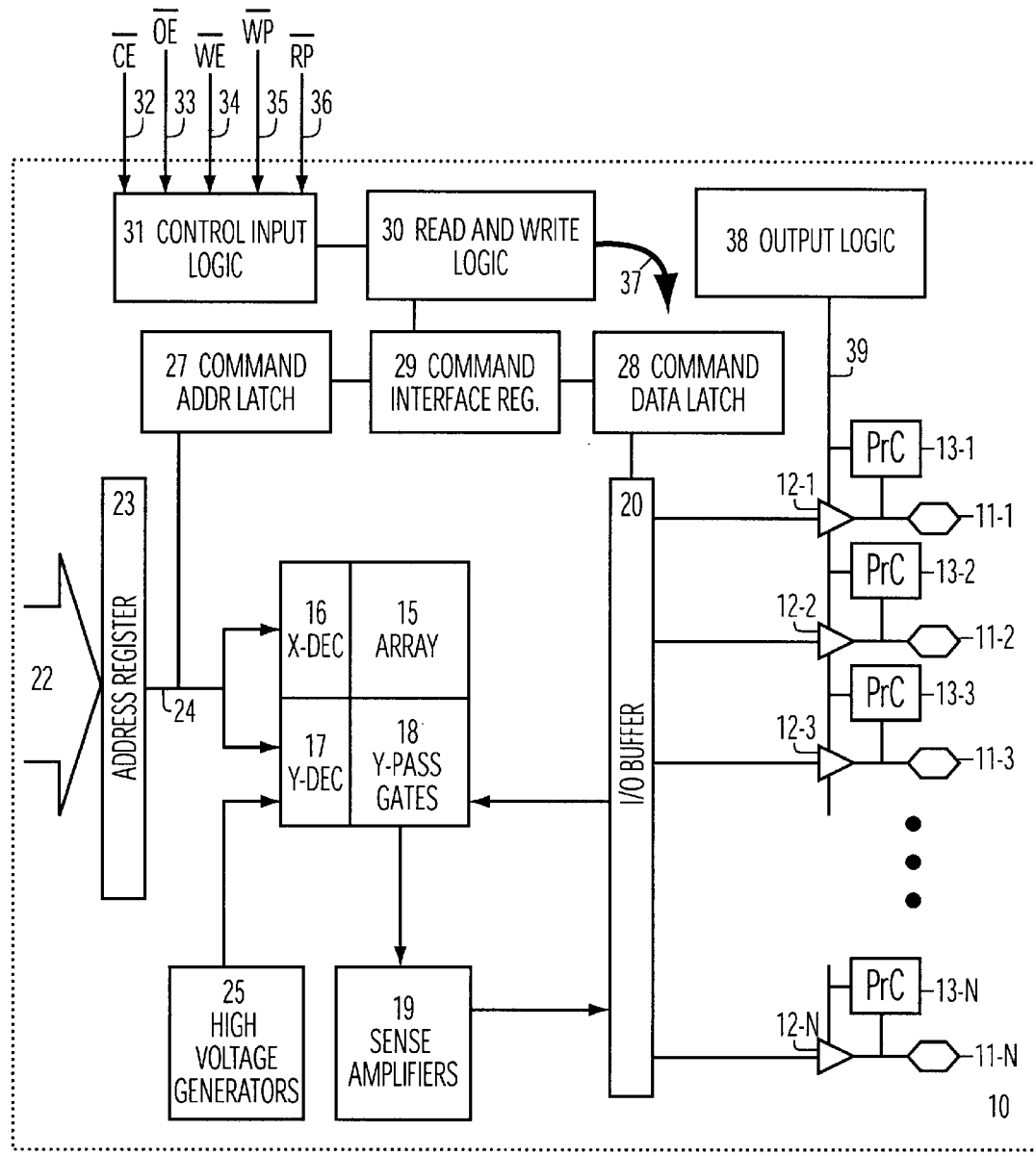
FIG. 1 is a block diagram of an integrated circuit memory device having the output pad precharge circuit of the present invention.

A detailed description of the present invention is provided with reference to the figures. FIG. 1 shows an integrated circuit memory device 10, having a plurality of output pads 11-*l* through 11-*N*, driven by a corresponding plurality of input/output driver circuits 12-*l* through 12-*N*. According to the present invention, each output pad 11-*l* through 11-*N* is also coupled to a precharge circuit 13-*l* through 13-*N*, which includes pull up and pull down circuits that are independent of the input/output driver circuits 12-*l* through 12-*N*.

In the embodiment shown, the integrated circuit 10 is a memory device including an array 15 of storage cells. An x-decoder 16 is coupled to the array. A plurality of y-pass gates 18 are coupled to the y-decoder 17 and to bit lines through the array 15. The pass gates are coupled to a set of sense amplifiers 19 and to an input/output buffer 20. The input/output buffer 20 drives the input/output drivers 12-*l* through 12-*N*. The input/output buffer 20 also provides input data through the y-pass gates 18 into the array 15. The integrated circuit 10 includes address inputs 22 which are coupled to address register 23. The address register 23 supplies addresses on line 24 to the x-decoder 16 and to the y-decoder 17.

The preferred embodiment comprises a floating date memory device, such as a flash memory. In this embodiment, high voltage generators 25 are coupled to the array 15 for use in the program and erase operations. Alternative embodiments include read-only memory arrays, SRAM arrays, DRAM arrays, or other types of memory devices.

In the embodiment shown, the integrated circuit 10 includes a command address latch 27 and a command data latch 28 which are respectively coupled to the address register 23 and the I/O buffer 20. The command address latch and the command data latch are coupled to a command interface register 29, which is in turn coupled to read and write control logic 30. The integrated circuit is responsive to sequences of address and data signals to control the mode of operation of the device, as known in the art. Additional control logic on the integrated circuit including control input logic 31 receives a set of external control signals including a chip enable signal on line 32, and output enable signal on line 33, a write enable signal on line 34, and other control signals on lines 35 and 36.

The read and write control logic 30 produces control signals on line 37 which are distributed among components of the chip for controlling the operation of the device. In FIG. 1, an output logic block 38 is shown to represent the portions of the control logic which produce control signals on line 39 for controlling the input/output drivers 12-*l* through 12-*N* and the precharge circuits 13-*l* through 13-*N*.

In the preferred system, the control signals on line 39 include tristate enable signals for controlling the output drivers in the input/output circuits 12-*l* through 12-*N*, and output enable signals or other signals which indicate the beginning of a data output event such as a read cycle.

Figure 2:
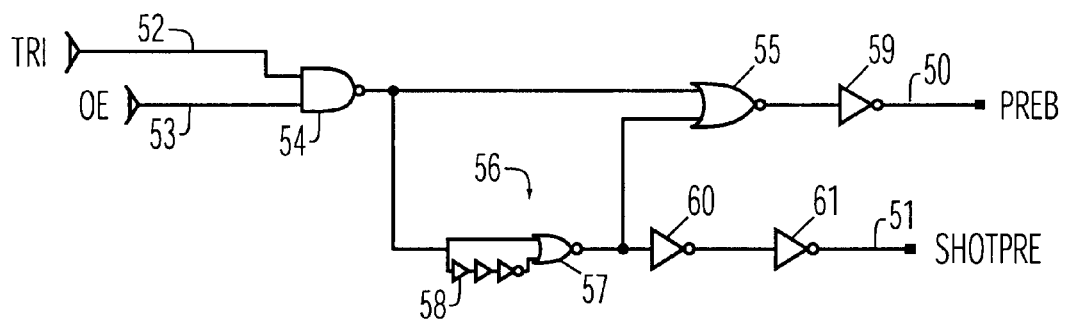
FIG. 2 is a diagram of logic used for producing control signals for the precharge circuit of the present invention.
Figure 3:
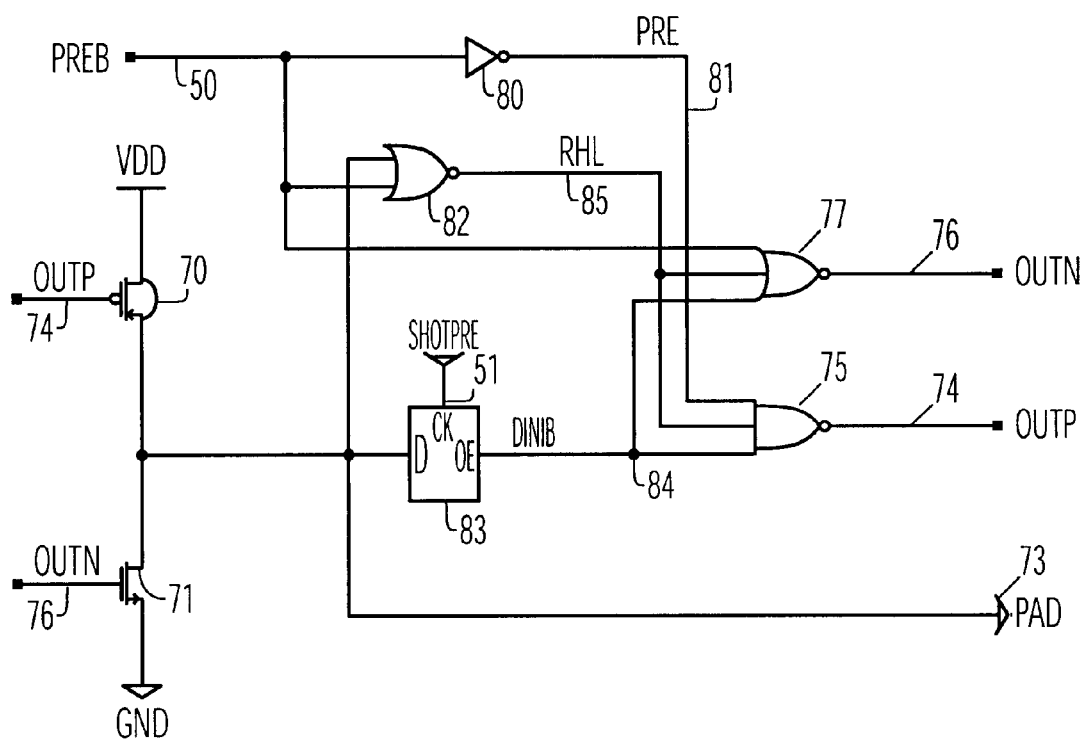
FIG. 3 is a diagram of an embodiment of the precharge circuit of the present invention, which is responsive to the control signals produced by the logic in FIG. 2.

FIG. 2 and FIG. 3 illustrate the output logic and the precharge circuits according to a preferred embodiment of the present invention. In FIG. 2, logic is illustrated which produces a first control signal PREB on line 50 and a second control signal SHOTPRE on line 51. The inputs to the logic in FIG. 2 include a tri-state signal TRI on line 52, and an output enable signal OE on line 53, which are produced in the preferred embodiment by the read and write logic 30, or other control logic on the device. The output enable signal OE indicates that a read cycle is occurring. The tri-state signal TRI signals when the output driver is enabled to supply an output signal supplied from the read cycle.

The tri-state signal TRI and the output enable signal OE are supplied as inputs to a NAND gate 54. The output of NAND gate 54 is supplied as one input to a NOR gate 55. The output of the NAND gate 54 is also supplied as an input to pulse generating circuit 56, which includes NOR gate 57 and a sequence of delay stages 58. The output of the NOR gate 57 is a pulse having a width substantially equal to the delay caused by the delay stages 58. The output of the NOR gate 57 is also supplied as an input to the NOR gate 55. The output of the NOR gate 55 is supplied through an inverter 59 as the control signal PREB on line 50. Also, the output of the NOR gate 57 is applied through inverter 60 and inverter 61 as the control signal SHOTPRE on line 51. The control signal SHOTPRE on line 51 acts as a pulse indicating the beginning of a read cycle. The control signal PREB on line 50 acts as a control signal which is asserted at the beginning of a precharge cycle, and de-asserted at the end of the precharge cycle, when the tristate signal TRI is asserted to enable the output drivers (see FIG. 6 for example).

The control signals PREB on line 50 and SHOTPRE on line 51 are supplied to the precharge circuit shown in FIG.

Figure 6:
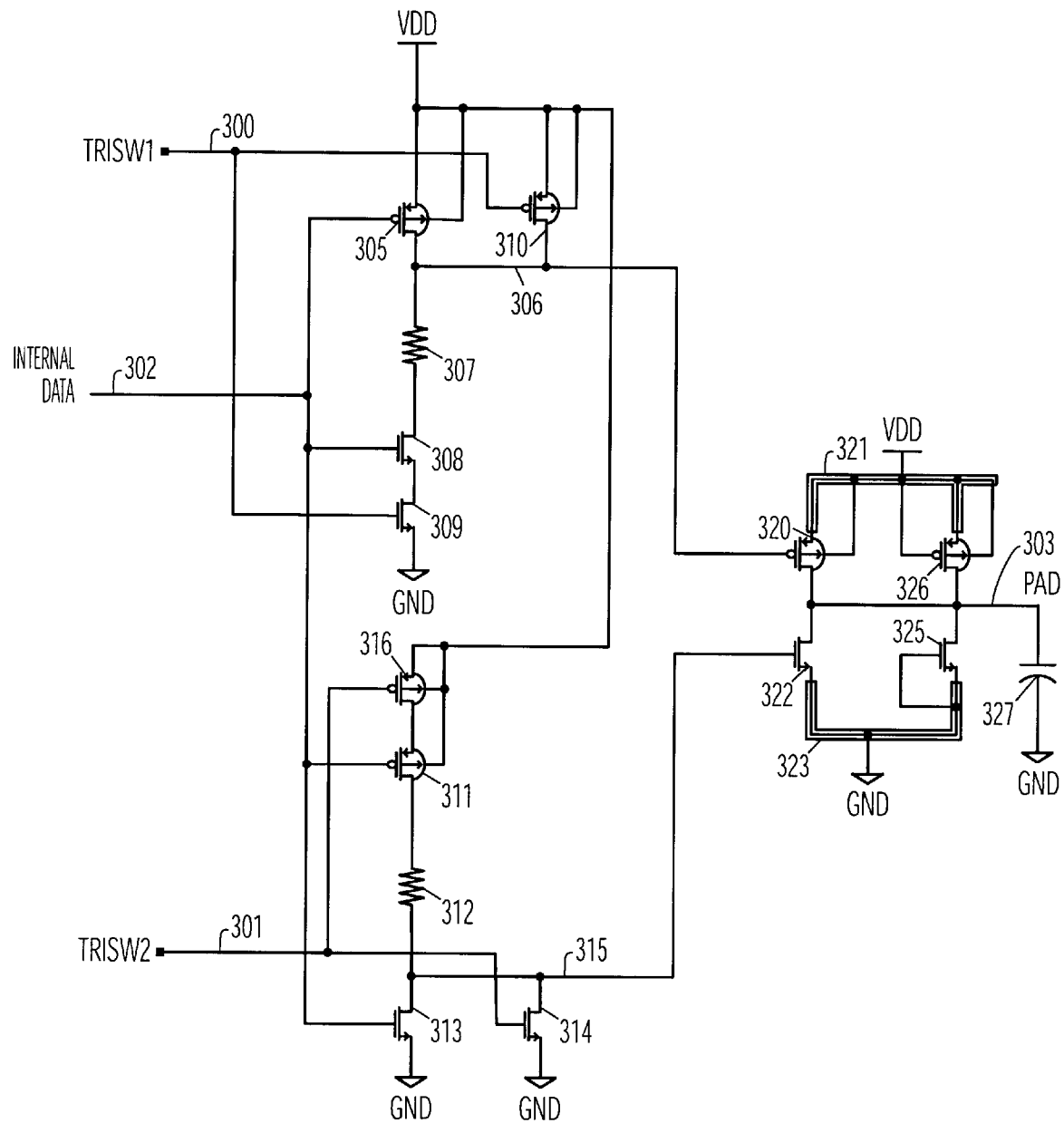
FIG. 6 is a diagram of a representative output driver for use in combination with the precharge circuit of the present invention.

3, and act as timing control signals. The precharge circuit includes a pull up circuit comprising p-type transistor 70 having its drain coupled to node 73 which is connected to the output pad 73, and its source connected to the supply potential VDD. The gate of the transistor 70 receives a control signal OUTP on line 74, which is produced at the output of the NAND gate 75. The precharge circuit also includes a pull down circuit comprising n-type transistor 71. Transistor 71 has its drain connected to node 73, and its source connected to ground. The gate of transistor 71 receives the control signal OUTN on line 76, which is produced at the output of the NOR gate 77. The pull up circuit and the pull down circuit are independent of the output driver for the pad 73. Thus, an additional output driver circuit (not shown in FIG. 3) is coupled to the pad 73. One representative output driver circuit is shown in FIG. 6 described below.

The control signals OUTP and OUTN control the pull up and pull down circuit respectively, in response to the logic shown in FIG. 3. The logic receives as input the control signal PREB on line 50 and the control signal SHOTPRE on line 51 is mentioned before. The signal on line 50 is supplied through an inverter 80 to produce the control signal PRE on line 81. Likewise, the signal on line 50 is supplied as input to NOR gate 82, and as input to NOR gate 77. The second input to the NOR gate 82 is node 73 which is coupled to the pad.

The control signal SHOTPRE on line 51 is connected to a clock input of a D-type latch 83. The D-type latch 83 has its D input coupled to the node 73. The output of the D-type latch 83 is a control signal DINIB on line 84. Line 84 is connected as one input to the NOR gate 77, and as one input to the NAND gate 75.

The NOR gate 82 produces a control signal RHL on line 85, which is supplied as one input to the NOR gate 77 and as one input to the NAND gate 75.

The latch 83 acts as a sence circuit to sense the level of the output pad 73 in response to the control signal SHOTPRE on line 51, at the beginning of a read cycle. The latch has a trip voltage which is near a threshold level, which in the preferred embodiment is about equal to the midpoint between a high logic level output and a low logic level output on the output pad 73. Therefore, the control signal DINIB on line 84 indicates an initial state of the output pad 73, relative to the threshold, If the voltage on the pad 73 is above the threshold, then the control signal DINIB on line 84 will be low. If the voltage on pad 73 is below the threshold, then the control signal DINIB on line 84 will be high.

The NOR gate 82 acts as a detector which is enabled in response to the control signal PREB on line 50. The NOR gate 82 has a trip voltage level on its input which is coupled to the node 73 which is near the threshold, preferably about midway between the high logic voltage level and the low logic voltage level on the output pad. The trip voltage level of the NOR gate 82 need not be exactly the same as the trip voltage level of the latch 83. In the preferred embodiment, the trip voltage levels that define the thresholds of the sense circuit and of the detector circuit are relatively close for precise operation of the precharge circuit.

As can be seen, the control signal OUTP on line 74 is low to turn on the pull up transistor 70, only when all of the control signal PRE on line 81, the control signal RHL on line 85, and the control signal DINIB on line 84 are high. The control signal OUTN on line 76 is high to turn on the pull down transistor 71, only when the control signal PREB on line 50, the control signal RHL on line 85, and the control signal DINIB on line 84 are all low.

Figure 4:
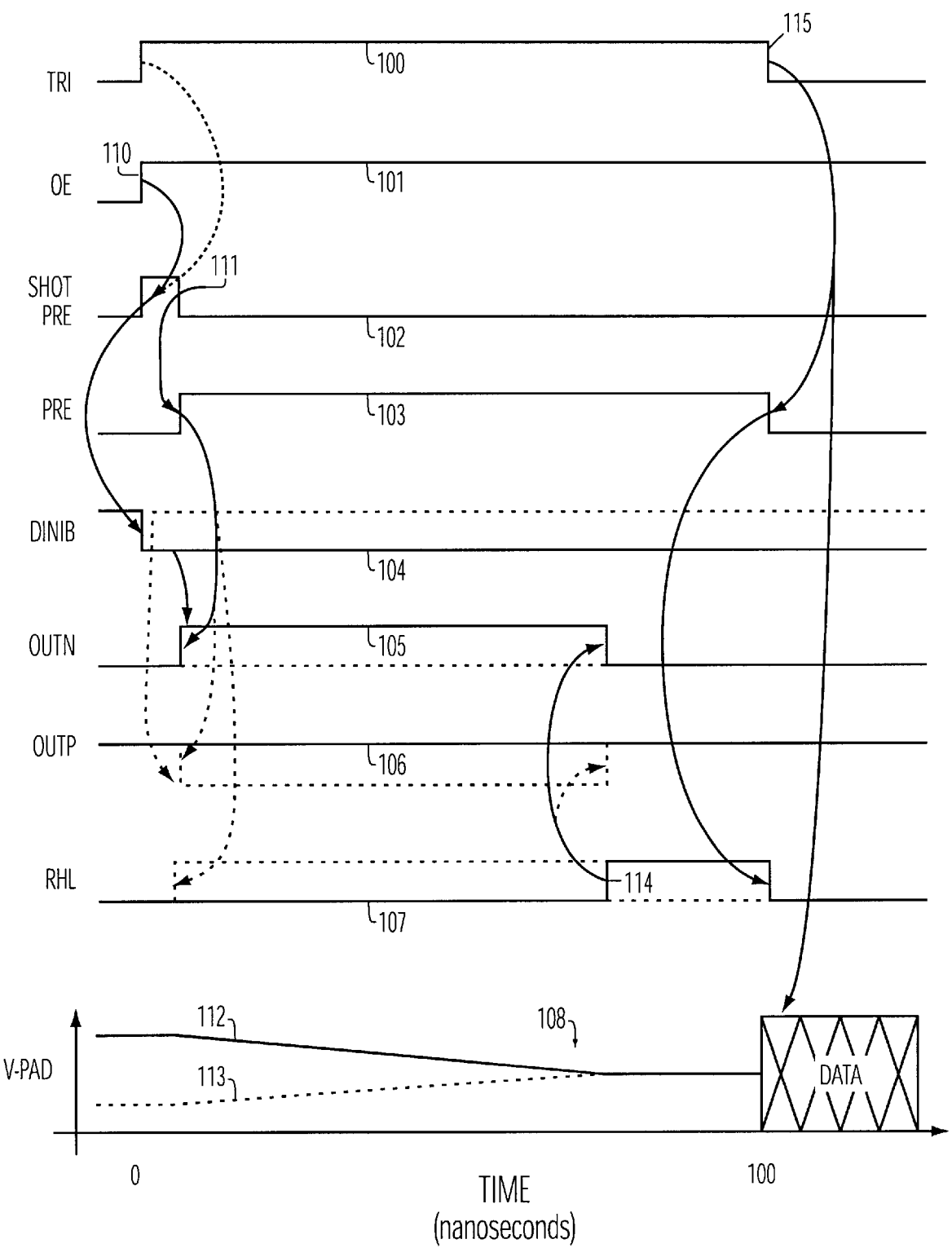
FIG. 4 is a timing diagram used for description of the operation of the precharge circuit of the present invention.

FIG. 4 is a timing diagram illustrating the operation of the logic of FIGS. 2 and 3. The timing diagram illustrates the control signals TRI, OE, SHOTPRE, PRE, DINIB, OUTN, OUTP, and RHL on traces 100 through 107. Trace 108 illustrates the voltage on the output pad.

At the beginning of a data output event, the output driver is in a high-impedance, tri-state condition as indicated by the control signal TRI being, or becoming, high. When the read cycle begins at point 110, at least one of the control signal TRI and the output enable signal OE changes from low to high. The read cycle is started i this example by an address transition, which causes the TRI signal to transition, when the output enable signal OE is high, or by a transition in the output enable signal OE when the TRI signal is high. This causes the control signal SHOTPRE to transition at point 110 to a high state for a short interval, and transition to a low state at point 111. In response to the transition at point 110, the control signal DINIB latches the initial state of the output pad. If the initial state is high, as indicated on line 112 of trace 108, then DINIB is low as indicated on trace 104 in the solid line. If the initial state is low as indicated on line 113 of trace 108, then the control signal DINIB is high as indicated by the dotted line. At point 111, the control signal PRE transitions to a high state, which causes the output OUTN to transition to a high state if DINIB is low. This turns on the pull down transistor causing the voltage level on trace 112 to fall. At point 114, the control signal RHL transitions to a high state indicating that the voltage level on trace 112 has reached the threshold of the detector. This turns off the pull down circuit by causing the control signal OUTN to transition to a low state. At time 115, the output driver is enabled by the control signal TRI transition to the low state. This causes the control signal PRE to go to the low state, and turns off the control signal RHL. At that point, data can be made available on the output pad.

If at time 111, the control signal DINIB were in a high state, the control signal RHL would also be driven to a high state. This causes the control signal OUTP to be driven to a low state, turning on the pull up driver. This causes the voltage level on the output pad to rise as indicated on line 113. When the voltage level on the output pad reaches the threshold, then the control signal RHL transitions to the low state, turning off the pull up driver. At time 115, data can be made available on the output pad.

As can be seen in FIG. 4, the control signal PRE and its complement PREB, define the length of the precharge interval, starting near the beginning of the read cycle, and ending when internal data is available to the output driver, signaled in this example by the assertion of the tristate signal TRI which enables the output driver. This interval can be precisely controlled to match the amount of time required by the internal circuitry to produce an output signal for the output driver. For example, the speed of this operation can be controlled by the driving power of the pull up and pull down transistors in the precharge circuit.

Figure 5:
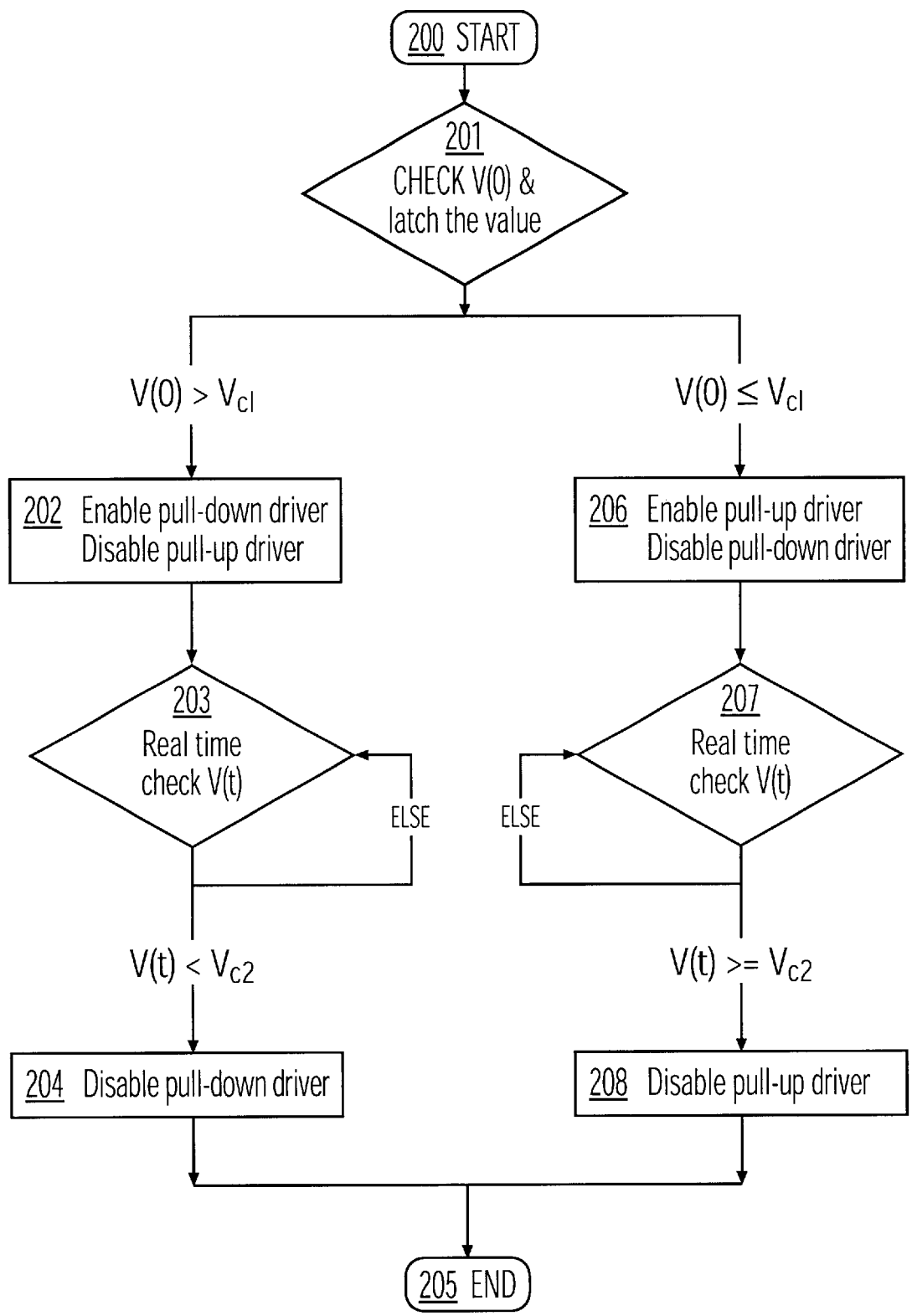
FIG. 5 is a flow chart illustration of the operation of the present invention.

FIG. 5 is a flow chart that illustrates the method of operation of the pre-charge circuit of the present invention. The process begins in the example described above with the assertion of the control signal SHOTPRE, as represented at block 200. Next, the value V(t), for t=0, of the voltage on the output pad is sensed and a signal is stored indicating whether the value V (0) is greater than or less than the threshold $V_{c1}$, determined in the example described above by the trip point of the latch 83 (block 201). If the value V(0) is greater than the threshold $V_{c1}$, then the algorithm branches to block 202, at which the pull down driver is enabled and the pull up driver is disabled. Next, the value V(t) is monitored in real-time to determine when it falls below a threshold $V_{c2}$, determined in the example described above by the trip point of the NOR gate 82 (block 203). The thresholds $V_{c1}$ and $V_{c2}$ are near one another in value in the preferred system. When the value V(t) falls below a threshold $V_{c2}$, the pull down driver is disabled (block 204). The pre-charge process ends in the example described above when internal data is available indicated by the control signal TRI (block 205).

If at block 201, it is determined that the value V(0) was less than or equal to the threshold $V_{c1}$, then the pull up driver is enabled, and the pull down driver is disabled (block 206). Next, the voltage level V(t) on the output pad is monitored to determine when it becomes greater than or equal to the threshold $V_{c2}$ (block 207). At that point, the pull up driver is disabled (block 208), and the process ends at block 205.

As mentioned before, the precharge circuit of the present invention uses pull up and pull down drivers which are separate from the pull up and pull down drivers used in the accompanying output driver for the data. This avoids problems, for example, with noise that might occur if the pull up and pull down drivers were shared. FIG. 6 illustrates an output driver for use with the precharge circuit of FIG. 3. The inputs to driver shown in FIG. 6 include the control signals TRISW1 and TRISW2 on lines 300 and 301, respectively. Also, internal data from a memory array or other source of data signals is supplied on line 302. The driver supplies output data to the output pad at node 303. Node 303 corresponds to the node 73 of FIG. 3. The control signals TRISW1 corresponds to the signal TRI, and TRISW2 corresponds to a complement of the signal TRI, as input to the NAND gate 54 of FIG. 2.

The driver includes a p-type transistor 305 having its source and well coupled to the supply potential VDD, its gate coupled to the data signal line 302, and its drain coupled to node 306. A resistor 307 is connected between node 306 and the drain of n-type transistor 308. The source of n-type transistor 308 is connected to the drain of n-type transistor 309. The source of n-type transistor 309 is coupled to ground. The gate of n-type transistor 308 is connected to the data signal line 302. The gate of n-type transistor 309 is connected to the control signal line 300. In addition, there is a p-type transistor 310 having its drain coupled to node 306, its source and well coupled to the supply potential VDD, and its gate coupled to the control signal line 300.

The circuit including transistors 305, 308, 309, and 310 operates like a NAND gate, to hold the node 306 at the supply potential VDD when the control signal TRISW1 is low. When the control signal TRISW1 is high, then the node 306 is controlled by the internal data on data line 302.

The driver also includes a p-type transistor 316 having its source and well coupled to the supply potential VDD, and its drain coupled to the source of p-type transistor 311. The well of p-type transistor is coupled to the supply potential VDD. The drain of transistor 311 is coupled to resistor 312. The opposite terminal of the resistor 312 is connected to the drain of n-type transistor 313 and to the drain of n-type transistor 314 at the node 315. The sources of transistors 313 and 314 are coupled to ground. The gate of transistor 316 is coupled to the control signal line 301. The gate of transistor 311 is coupled to the data signal line 302. Likewise, the gate of transistor 313 is coupled to the data signal line 302, and the gate of transistor 314 is coupled to the control signal line 301.

The circuit including transistors 316, 311, 313, and 314 operates like a NOR gate, to hold the node 315 at ground when the control signal TRISW2 is high. When the control signal TRISW2 is low, then the node 315 is controlled by the internal data on data line 302.

Node 306 is coupled to the gate of a pull up, p-type transistor 320. The source and the well of the pull up transistor 320 are connected to the supply potential VDD via a high current connection 321. The source of the transistor 320 is coupled to the output pad 303. In a similar manner, node 315 is coupled to the gate of a pull down, n-type transistor 322. The drain of the transistor 322 is coupled to the output pad 303, and the source of the transistor 322 is coupled via a high current connection 323 to ground.

The driver also includes an electrostatic discharge protection circuit based on p-type transistor 324 and n-type transistor 325. Transistor 324 has its gate, source and well coupled to the supply potential VDD. The drain of transistor 324 is coupled to the output pad 303. The transistor 325 has its gate and source coupled to ground. The drain of transistor 325 is coupled to the output pad 303.

As mentioned before, the output pad 303 has significant capacitance represented by the capacitor symbol 327. Thus the pull up transistor 320 and the pull down transistor 322 are relatively large transistors selected for the purpose of high-speed driving of the voltage on the pad 303. Also, the transistors 320 and 322 are not used in the precharge circuit in the preferred embodiment of the present invention.

Accordingly, the present invention provides a precharge circuit which is independent of the output driver, and thereby isolated from the read path of the device to provide better noise immunity. The circuit operates by sensing the initial voltage on the output at the beginning of a data output event. In response to the initial voltage, and only after the initial voltage is sensed, a precharge or discharge action is taken. This avoids mistakes in the setup of the precharge circuit.

Furthermore, the precharge circuit of the present invention has a very low standby current, particularly in the sensing circuitry. The NOR gate detector is only enabled during a precharge interval. If an inverter or other type of detector were utilized, then a large leakage current might take place because of unknown pad voltage on the input of the device.

The lengths of the precharge and discharge periods, and the gate voltage used for the pull up and pull down transistors of the precharge circuit are independent of the pad voltage, and independent of the data signal. This provides a circuit that operates predictably and quickly with maximum desired current drive.

Overall, the precharge circuit of present invention is precise, low-cost and the uses a minimum area on the integrated circuit of which is used.

While the present inventions disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the appended claims.

What is claimed is:

1. A driver for an output of an integrated circuit, comprising:

a driver to supply an output signal to the output;

a sense circuit to sense an initial state before the output signal is supplied to the output, which indicates whether a voltage level on the output is above a threshold or below a threshold;

a precharge circuit coupled to the output, responsive to the sense circuit, to drive the output to near the threshold in response to the initial state before the output signal is supplied to the output.

2. The driver of claim 1, including a detector coupled to the output which produces a control signal indicating when the output is near the threshold, and logic responsive to the control signal to turn off the precharge circuit.

3. The driver of claim 2, wherein the precharge circuit includes a pull up circuit and a pull down circuit, the pull up circuit being responsive to the initial state indicating that the voltage level on the output is below the threshold, and the pull down circuit being responsive to the initial state indicating that the voltage level on the output is above the threshold.

4. The driver of claim 1, including logic to produce a control signal in response to a data output event, and wherein the sense circuit stores the initial state in response to the control signal.

5. The driver of claim 1, including logic to produce a first control signal and a second control signal in response to a data output event, wherein the sense circuit stores the initial state in response to the first control signal, and including a circuit to enable and disable the precharge circuit in response to the second control signal.

6. The driver of claim 1, wherein output driver is enabled at a time during a particular data output event, and including logic to produce a control signal in response to the particular data output event, and a circuit to enable and disable the precharge circuit in response to the control signal before the time that the output driver is enabled.

7. The driver of claim 1, wherein output driver is enabled at a time during a particular data output event, and including logic to enable the precharge circuit at the beginning of a precharge interval and disable the precharge circuit at the end of the precharge interval, the precharge interval having a specified length and occurring before the time that the output driver is enabled.

8. The driver of claim 1, wherein the sense circuit comprises a latch having a trigger voltage near the threshold to store the initial value, and including a gate enabled during the data output event having a trigger voltage near the threshold to produce a control signal, and logic responsive to the control signal to turn off the precharge circuit.

9. The driver of claim 7, including a gate enabled i response to a second control signal and having a trigger voltage near the threshold to produce a control signal, and logic responsive to the control signal to turn off the precharge circuit.

10. The driver of claim 1, wherein the sense circuit comprises a latch having a trigger voltage near the threshold to store the initial value.

11. An integrated circuit memory device having a data output; comprising:
    a memory array;
    read circuitry, coupled to the memory array and responsive to a read signal, to read data in the array, to supply an output signal indicating the read data;
    an output driver, coupled to the read circuitry and to the data output, responsive to assertion of an enable signal to supply the output signal to the data output;
    a sense circuit, coupled to the data output and responsive to the read circuitry, to sense an initial state before assertion of the enable signal, which indicates whether a voltage level on the output is above a threshold or below a threshold;
    a precharge circuit coupled to the data output, responsive to the sense circuit, to drive the data output to near the threshold before assertion of the enable signal.

12. The device of claim 11, including a detector coupled to the data output which produces a control signal indicating when the data output is near the threshold, and logic responsive to the control signal to turn off the precharge circuit.

13. The device of claim 12, wherein the precharge circuit includes a pull up circuit and a pull down circuit, the pull up circuit being responsive to the initial state indicating that the voltage level on the output is below the threshold, and the pull down circuit being responsive to the initial state indicating that the voltage level on the output is above the threshold.

14. The device of claim 11, including logic to produce a control signal in response to the read signal, and wherein the sense circuit stores the initial state in response to the control signal.

15. The device of claim 11, including logic to produce a first control signal and a second control signal in response to the read signal, wherein the sense circuit stores the initial state in response to the first control signal, and including a circuit to enable and disable the precharge circuit in response to the second control signal.

16. The device of claim 11, including logic to enable the precharge circuit at the beginning of a precharge interval and disable the precharge circuit at the end of the precharge interval, the precharge interval having a specified length and occurring before assertion of the enable signal.

17. The device of claim 11, wherein the sense circuit comprises a latch having a trigger voltage near the threshold to store the initial value.

18. The drive of claim 15, including a gate enabled in response to the second control signal and having a trigger voltage near the threshold to produce a control signal, and logic responsive to the control signal to turn off the precharge circuit.

19. An output precharge circuit for an output of an integrated circuit having an output driver, comprising:
    control logic responsive to a data output event, to produce a first control signal and a second control signal before the output driver is enabled for the data output event;
    a latch, responsive to the first control signal and having a trigger voltage near a threshold to store an initial state which indicates whether a voltage level on the output is above the threshold or below the threshold;
    a pull up circuit and a pull down circuit, both being enabled and disabled in response to the second signal, the pull up circuit being responsive to the initial state indicating that the voltage level on the output is below the threshold, and the pull down circuit being responsive to the initial state indicating that the voltage level on the output is above the threshold; and
    a gate enabled in response to the second control signal and having a trigger voltage near the threshold, and logic responsive to the gate to turn off the pull up circuit and the pull down circuit.

* * * * *